US012764979B2

(12) United States Patent
Li et al.

(10) Patent No.: US 12,764,979 B2
(45) Date of Patent: Oct. 13, 2026

(54) SEMICONDUCTOR STRUCTURE WITH A DEEP TRENCH CAPACITOR STRUCTURES AND FORMING METHOD THEREOF

(71) Applicant: UNITED MICROELECTRONICS CORP., Hsin-Chu City (TW)

(72) Inventors: Yi-Fan Li, Tainan City (TW); Nan-Yuan Huang, Tainan City (TW); Kuan-Jhih Hou, Chiayi County (TW); Yu-Fu Wang, Taoyuan City (TW); Ya-Yin Hsiao, Taipei City (TW); Po-Ching Su, Tainan City (TW); Ti-Bin Chen, Tainan City (TW); Chih-Chiang Wu, Tainan City (TW); Yao-Jhan Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 345 days.

(21) Appl. No.: 18/583,828

(22) Filed: Feb. 21, 2024

(65) Prior Publication Data

US 2025/0240985 A1 Jul. 24, 2025

(30) Foreign Application Priority Data

Jan. 18, 2024 (TW) ................................ 113101956

(51) Int. Cl.

| | |
|---|---|
| ***H01L 29/94*** | (2006.01) |
| ***H01L 21/768*** | (2006.01) |
| ***H01L 25/065*** | (2023.01) |
| ***H01L 27/08*** | (2006.01) |
| ***H01L 29/66*** | (2006.01) |
| ***H10D 1/00*** | (2025.01) |
| ***H10D 1/66*** | (2025.01) |
| ***H10D 84/00*** | (2025.01) |

(Continued)

(52) U.S. Cl.
CPC ............. *H10D 1/665* (2025.01); *H10D 1/047* (2025.01); *H10D 84/212* (2025.01); *H10W 20/089* (2026.01); *H10W 90/00* (2026.01); *H10W 90/722* (2026.01)

(58) Field of Classification Search
CPC ...... H10D 1/047; H10D 1/665; H10D 84/212; H10B 12/038; H10B 12/0385; H10B 12/0387; H10B 12/37; H10B 12/373; H10W 20/089; H10W 90/00; H10W 90/722
See application file for complete search history.

(56) References Cited

U.S. PATENT DOCUMENTS

| | | | |
|---|---|---|---|
| 5,629,226 | A | 5/1997 | Ohtsuki |
| 5,891,807 | A | 4/1999 | Muller |
| 6,018,174 | A | 1/2000 | Schrems |

(Continued)

*Primary Examiner* — David C Spalla
(74) *Attorney, Agent, or Firm* — Winston Hsu

(57) ABSTRACT

The invention provides a semiconductor structure with a deep trench capacitor structures, which comprises a substrate, the substrate comprises a bottle-shaped trench, wherein the bottle-shaped trench has an upper part and a lower part in a cross section, and the interface between the upper part and the lower part is a bottleneck line, wherein the bottleneck line is the part with the smallest width in the bottle-shaped trench, a first dielectric layer is filled in the bottle-shaped trench, and a void is located in the first dielectric layer, wherein the highest point of the void is lower than the bottleneck line.

18 Claims, 3 Drawing Sheets

(51) Int. Cl.
*H10W 20/00* (2026.01)
*H10W 90/00* (2026.01)

(56) References Cited

U.S. PATENT DOCUMENTS

| | | | | |
|---|---|---|---|---|
| 6,103,585 | A * | 8/2000 | Michaelis | H10B 12/038 257/E21.651 |
| 6,188,096 | B1 | 2/2001 | Collins | |
| 6,359,300 | B1 | 3/2002 | Economikos | |
| 6,365,485 | B1 | 4/2002 | Shiao | |
| 6,580,110 | B2 | 6/2003 | Schrems | |
| 6,756,626 | B2 | 6/2004 | Lutzen | |
| 8,049,264 | B2 * | 11/2011 | Seidl | C23C 16/34 257/315 |
| 8,536,709 | B1 | 9/2013 | Hsu | |
| 8,754,504 | B2 | 6/2014 | Hsu | |
| 8,776,363 | B2 | 7/2014 | Hsu | |
| 8,921,901 | B1 | 12/2014 | Kao | |
| 9,224,696 | B2 | 12/2015 | Li | |
| 2004/0036051 | A1 * | 2/2004 | Sneh | H10B 12/038 257/E21.651 |
| 2013/0062677 | A1 * | 3/2013 | Li | H10B 12/038 438/389 |
| 2016/0020267 | A1 * | 1/2016 | Lin | H10D 1/042 257/532 |
| 2021/0202761 | A1 * | 7/2021 | Cheng | H10D 1/042 |
| 2023/0012211 | A1 * | 1/2023 | Jo | H01G 4/35 |

* cited by examiner

SEMICONDUCTOR STRUCTURE WITH A DEEP TRENCH CAPACITOR STRUCTURES AND FORMING METHOD THEREOF

BACKGROUND OF THE INVENTION

1. Field of the Invention

The invention relates to the field of semiconductors, in particular to a semiconductor structure with a special shape deep trench capacitor.

2. Description of the Prior Art

With the development of semiconductor technology, the size of various electronic components is getting smaller and smaller. How to accommodate more electronic components in a limited unit space is the sustainable development direction and goal of this field. Capacitance structure has the function of storing charge, so it is often used to make one of the main components of various semiconductor electronic devices such as memory.

The conventional planar capacitor structure includes three layers, one of which is an insulating layer sandwiched between two metal layers. However, with the development of technology, the requirements for the storage charge of capacitors are gradually increasing. If the manufacturers want to make a capacitor that can store more charges, it need to increase the area of the capacitor, that is to say, increase the area of the metal layer and the insulating layer, but at the same time, the capacitor will occupy a larger area of the semiconductor device, which is not conducive to the miniaturization of the product.

SUMMARY OF THE INVENTION

The invention provides a semiconductor structure with a deep trench capacitor, which comprises a substrate, wherein the substrate comprises a bottle-shaped trench, wherein the bottle-shaped trench has an upper part and a lower part in cross section, and the interface between the upper part and the lower part is a bottleneck line, wherein the bottleneck line is the part with the smallest width in the bottle-shaped trench, a first dielectric layer is filled in the bottle-shaped trench, and a void is located in the first dielectric layer, wherein the highest point of the void in the first dielectric layer is lower than the bottleneck line.

The invention also provides a method for forming a semiconductor structure comprising a deep trench capacitor, which comprises the following steps: providing a substrate, wherein a bottle-shaped trench is formed in the substrate, wherein the bottle-shaped trench has an upper part and a lower part in the cross section, and the interface between the upper part and the lower part is a bottleneck line, wherein the bottleneck line is the part with the smallest width in the bottle-shaped trench, and forming a first dielectric layer to fill the bottle-shaped trench, wherein the first dielectric layer contains a void located in the first dielectric layer, and the highest point of the void in the first dielectric layer is lower than the bottleneck line The present invention provides a structure for forming a deep trench capacitor on an interposer and a manufacturing method thereof. The present invention is characterized in that the trench of each deep trench capacitor is designed in a bottle shape and contains voids therein. Therefore, voids can be used to absorb stress and reduce the probability of interlayer (substrate) fracture. In addition, because the bottle-shaped trench can limit the voids to be located in the lower part of the whole bottle-shaped trench, the problem that the polishing slurry remains on the surface of the dielectric layer after the planarization step due to the excessively high voids can be avoided. The invention has the advantage of improving the product yield.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In order to make the following easier to understand, readers can refer to the drawings and their detailed descriptions at the same time when reading the present invention. Through the specific embodiments in the present specification and referring to the corresponding drawings, the specific embodiments of the present invention will be explained in detail, and the working principle of the specific embodiments of the present invention will be expounded. In addition, for the sake of clarity, the features in the drawings may not be drawn to the actual scale, so the dimensions of some features in some drawings may be deliberately enlarged or reduced.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words “up” or “down” that describe the relationship between components in the text, it is well known in the art and should be clearly understood that these words refer to relative positions that can be inverted to obtain a similar structure, and these structures should therefore not be precluded from the scope of the claims in the present invention.

Although the present invention uses the terms first, second, third, etc. to describe elements, components, regions, layers, and/or sections, it should be understood that such elements, components, regions, layers, and/or sections should not be limited by such terms. These terms are only used to distinguish one element, component, region, layer and/or block from another element, component, region, layer and/or block. They do not imply or represent any previous ordinal number of the element, nor do they represent the arrangement order of one element and another element, or the order of manufacturing methods. Therefore, the first element, component, region, layer or block discussed below can also be referred to as the second element, component, region, layer or block without departing from the specific embodiments of the present invention.

The term "about" or "substantially" mentioned in the present invention usually means within 20% of a given value or range, such as within 10%, or within 5%, or within 3%, or within 2%, or within 1%, or within 0.5%. It should be noted that the quantity provided in the specification is approximate, that is, the meaning of "about" or "substantially" can still be implied without specifying "about" or "substantially".

The terms "coupling" and "electrical connection" mentioned in the present invention include any direct and indirect means of electrical connection. For example, if the first component is described as being coupled to the second component, it means that the first component can be directly electrically connected to the second component, or indirectly electrically connected to the second component through other devices or connecting means.

Although the invention of the present invention is described below by specific embodiments, the inventive principles of the present invention can also be applied to other embodiments. In addition, in order not to obscure the spirit of the present invention, specific details are omitted, and the omitted details are within the knowledge of those with ordinary knowledge in the technical field.

Figure 1:
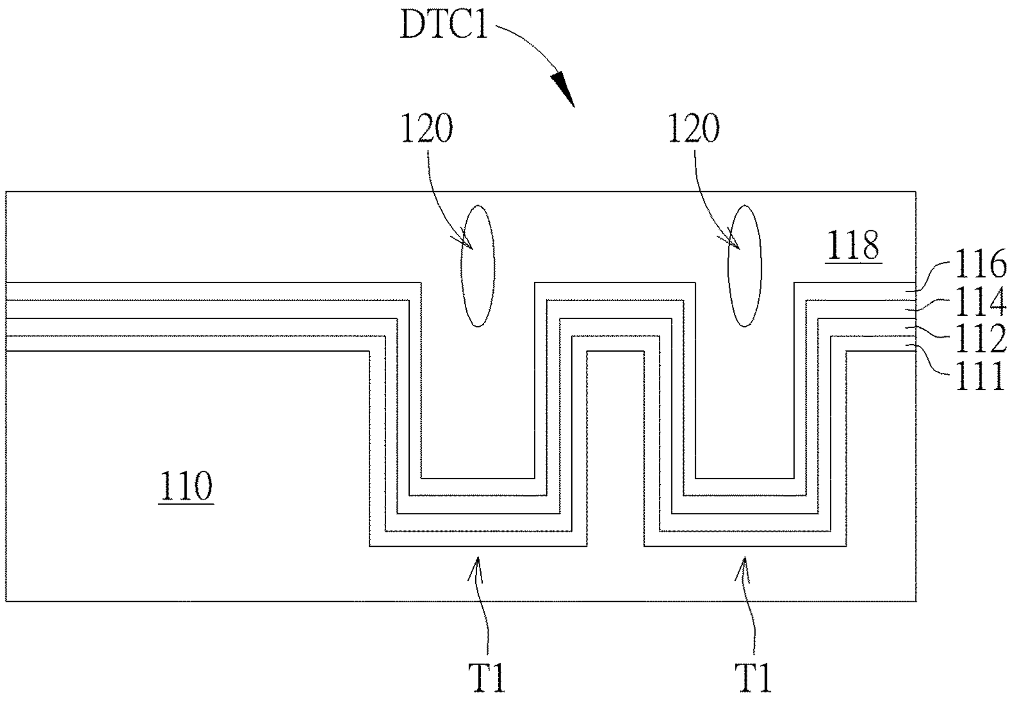
FIG. 1 is a schematic cross-sectional view of a deep trench capacitor according to an embodiment of the present invention.

Please refer to FIG. 1, which shows a schematic cross-sectional structure of a passive element of the present invention. As shown in FIG. 1, a deep trench capacitor DTC1 is provided in a substrate 110, which is, for example, a silicon substrate, wherein the manufacturing method of the deep trench capacitor DTC1 described in this embodiment includes forming a plurality of trenches T1 on the substrate 110 by exposure, development and etching, and the trenches T1 are preferably arranged in parallel with each other and have vertical sidewalls. Then, a liner layer 111 can be selectively formed in each trench T1. The function of the liner layer 111 is to help the electrode layer formed later to be better formed in the trench T1. The material of the liner layer 111 is titanium/titanium nitride, for example, but not limited to this. In some other embodiments, the liner layer 111 can also be selectively omitted and not formed. Next, a bottom electrode layer 112, an insulating layer 114 and a top electrode layer 116 are sequentially formed in the trench to form a deep trench capacitor DTC1. Subsequently, for example, a conductive layer can be formed to electrically connect the deep trench capacitor DTC1, and the conductive layer is not drawn here for simplicity of the drawing. In this embodiment, the bottom electrode layer 112 and the top electrode layer 116 are made of conductive materials, such as copper (Cu), chromium (Cr), titanium (Ti), tungsten (W), gold (Au), aluminum (Al), indium (In), tin (Sn), nickel (Ni), platinum (Pt) and silver (Ag) or alloys of the above materials, but not limited thereto. The material of the insulating layer 114 includes, but is not limited to, insulating materials such as silicon oxide, silicon nitride or silicon oxynitride. Therefore, the bottom electrode layer 112, the insulating layer 114 and the top electrode layer 116 constitute the deep trench capacitor DTC1, which creates a larger capacitance area by using the depth of the trench (that is, the inner sidewall and bottom surface of the trench can be regarded as a part of the capacitance area) compared with the general planar capacitor, so it has a larger capacitance value.

In practical application, the deep trench capacitor DTC1 of the embodiment of FIG. 1 can be formed on a circuit substrate (not shown), and then other electronic components (not shown) such as a memory or a chip can be connected to the deep trench capacitor DTC1. That is, the substrate 110 in FIG. 1 can be arranged between a circuit substrate (such as a printed circuit board) and an electronic component (such as a chip), and can be used as an interposer between them. In the general technology, the interposer includes conductive wire layers or conductive plugs used for conducting current, and its function is to connect the pins of a tiny chip to the pins of a larger circuit board.

However, in the process of forming trench T1 and filling material layers (the liner 111, the bottom electrode layer 112, the insulating layer 114 and the top electrode layer 116) in the trench T1, the deep trench capacitor DTC1 is formed in the dielectric layer (the substrate 110), because the stress gradually accumulates in the substrate 110, it may lead to the fracture of the substrate 110. In order to reduce the probability of fracture of the substrate 110, after the top electrode layer 116 in the deep trench capacitor DTC1 is completed, the surface of the substrate 110 is covered with a dielectric layer 118 and partially filled in the trench. At this time, the parameters of filling the dielectric layer 118 are controlled, so that a void 120 is generated in the dielectric layer 118. The function of the void 120 is that when the substrate 110 is squeezed by stress, the void 120 has the function of buffering and absorbing part of the stress, so that the probability of the substrate 110 cracking during the stress accumulation can be reduced. In other words, the voids 120 are deliberately formed in the dielectric layer 118 to reduce the probability of the substrate 110 being broken.

However, after the formation of the voids 120, although the probability that the substrate 110 is cracked due to stress is reduced, other additional problems are also generated. For example, the shape of the trench T1 shown in FIG. 1 has vertical sidewalls. When the voids 120 are formed, the dielectric layer 118 is gradually deposited into the trench T1. When the dielectric layers 118 on both sides of the trench sidewall contact each other, the void 120 is formed in the dielectric layers 118. However, since the sidewall of the trench is a vertical surface, it is difficult to control the position of the void 120, and the height of the top surface of the void 120 usually exceeds the height of the top surface of the trench T1 (that is, the top surface of the substrate 110). Please refer to FIG. 2, which shows a schematic cross-sectional structure of the deep trench capacitor DTC1 in an embodiment of the present invention. After the dielectric layer 118 is formed, a subsequent planarization step, such as chemical mechanical polishing (CMP), is performed to remove the excess dielectric layer 118. When the surface stopped by the planarization step overlaps with the position of the void 120, a groove 122 will be left on the surface of the planarized dielectric layer 118. Moreover, the slurry used in the planarization step may leave a residue 123 in the groove 122 on the surface of the dielectric layer 118. This is not conducive to the subsequent formation of other components (such as contact structures, etc.).

Therefore, in another embodiment of the present invention, in order to ensure that the position of the voids will not affect the planarization step while forming the voids, the trenches with different shapes are redesigned, as shown in the following paragraph in detail.

In the following, different embodiments of the deep trench capacitor structure and its forming method of the present invention will be described, and in order to simplify the description, the following description will mainly focus on the differences of each embodiment, and the similarities will not be repeated. In addition, the same elements in various embodiments of the present invention are labeled with the same reference numerals, so as to facilitate the comparison among various embodiments.

Figure 3:
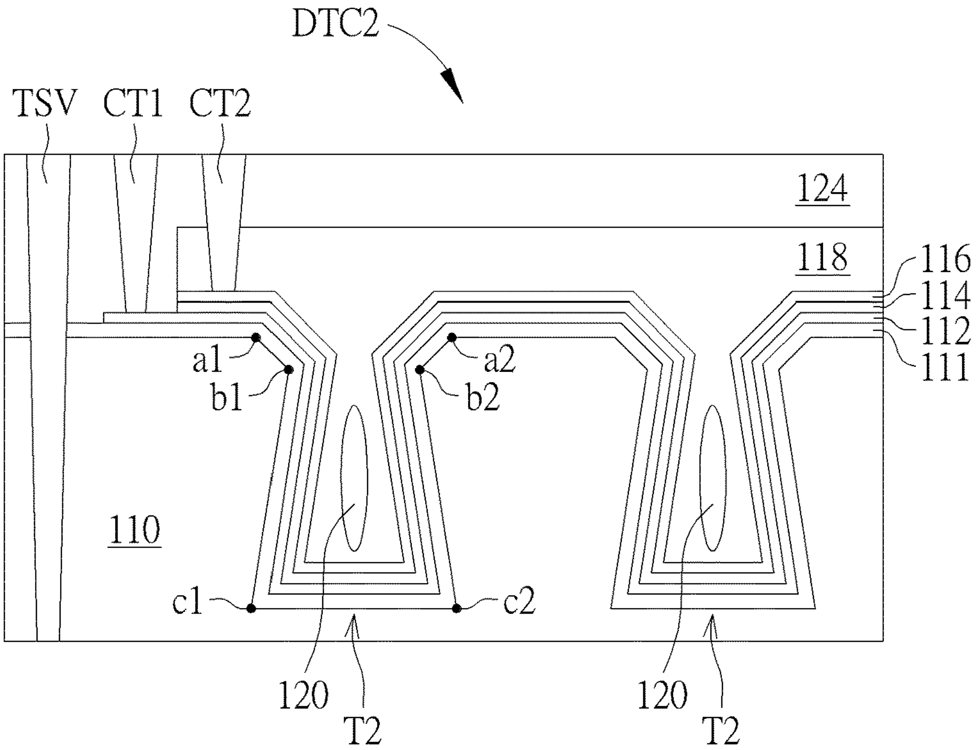
FIG. 3 is a schematic cross-sectional view of a deep trench capacitor according to another embodiment of the present invention.
Figure 4:
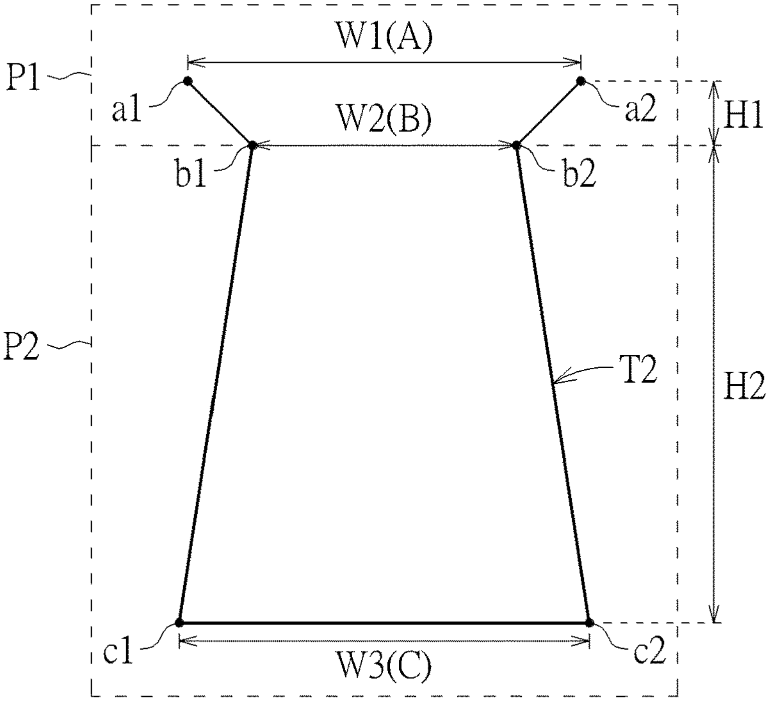
FIG. 4 is an enlarged cross-sectional view of the bottle-shaped trench according to FIG. 3 of the present invention.

FIG. 3 is a schematic cross-sectional view of a deep trench capacitor DTC2 according to another embodiment of the present invention. FIG. 4 is an enlarged cross-sectional view of the bottle-shaped trench according to FIG. 3 of the present invention. As shown in FIG. 3 and FIG. 4, a substrate 110 is provided, which includes a bottle-shaped trench T2, and the bottle-shaped trench T2 is sequentially filled with a liner 111, a bottom electrode layer 112, an insulating layer 114 and a top electrode layer 116 to form a deep trench capacitor DTC2 in the substrate 110. The materials of the substrate 110, the liner layer 111, the bottom electrode layer 112, the insulating layer 114 and the top electrode layer 116 described here are similar to or the same as those described in the first embodiment, so they are not repeated here.

The main difference between this embodiment and the first embodiment is the shape of the trench in the substrate 110. Seen from the sectional view, the trench T1 in FIG. 1 has a vertical side, while the contour of the bottle-shaped trench T2 in this embodiment has a shape similar to a water bottle. More specifically, referring to FIGS. 3 and 4, the bottle-shaped trench T2 in this embodiment defines points a1, b1 and c1 on the left side of the bottle-shaped trench T2, and additionally defines points a2, b2 and c2 on the right side of the bottle-shaped trench T2. The connecting line segment A between point a1 and point a2 is defined as the top surface of the bottle-shaped trench T2, the connecting line segment B between point b1 and point b2 is defined as the neck of the bottle-shaped trench T2 (or the bottleneck line of the bottle-shaped trench T2), and the connecting line segment C between point c1 and point c2 is defined as the bottom surface of the bottle-shaped trench T2. Among them, line segment A, line segment B and line segment C are all preferably parallel to each other along the horizontal direction, and the length of line segment B is shorter than line segment A and line segment C. Furthermore, the neck line of the bottle-shaped trench T2 (that is, the line segment B) is the smallest part of the cross-sectional width of the whole bottle-shaped trench T2, that is to say, from FIG. 3, the width of other parts of the bottle-shaped trench T2 except the neck along the horizontal direction is greater than the width of the neck (line segment B). In addition, FIG. 4 focuses on describing the shape of the bottle-shaped trench T2, so various material layers such as the liner layer 111, the bottom electrode layer 112, the insulating layer 114 and the top electrode layer 116 are omitted in FIG. 4.

In addition, in this embodiment, the side surface part of the bottle-shaped trench T2 between the point a1 and the point b1 is an inclined surface, and the side surface part of the bottle-shaped trench T2 between the point b1 and the point c1 is another inclined surface, and the profiles of these two inclined surfaces show two oblique straight lines in cross section, and these two oblique straight lines have different slopes. If the bottle-shaped trench T2 is divided from the neck (the line segment B) into an upper part P1 and a lower part P2, wherein the upper part P1 has an inverted trapezoidal profile (the top surface is wider and the bottom surface is narrower), and the lower part P2 has a regular trapezoidal profile (the top surface is narrower and the bottom surface is wider).

In addition, in this embodiment, the distance between the point a1 and the point b1 in the vertical direction is H1, and the distance between the point b1 and the point c1 in the vertical direction is H2, where H1/H2 is preferably less than 0.15, that is, if the bottle-shaped trench T2 is divided from the neck (the line segment B) into an upper part P1 and a lower part P2, the height of the lower part P2 is obviously greater than that of the upper part P1.

In this embodiment, the width of the top surface of the bottle-shaped trench T2 (that is, the length of line segment A) is defined as W1, the width of the neck of the bottle-shaped trench T2 (that is, the length of line segment B) is defined as W2, and the width of the bottom surface of the bottle-shaped trench T2 (that is, the length of line segment C) is defined as W3, where W2<W1 and W2<W3. In addition, in some embodiments, W2 is between 0.1 micron and 1 micron, and W1 and W3 are between 0.2 micron and 3 micron.

Figure 2:
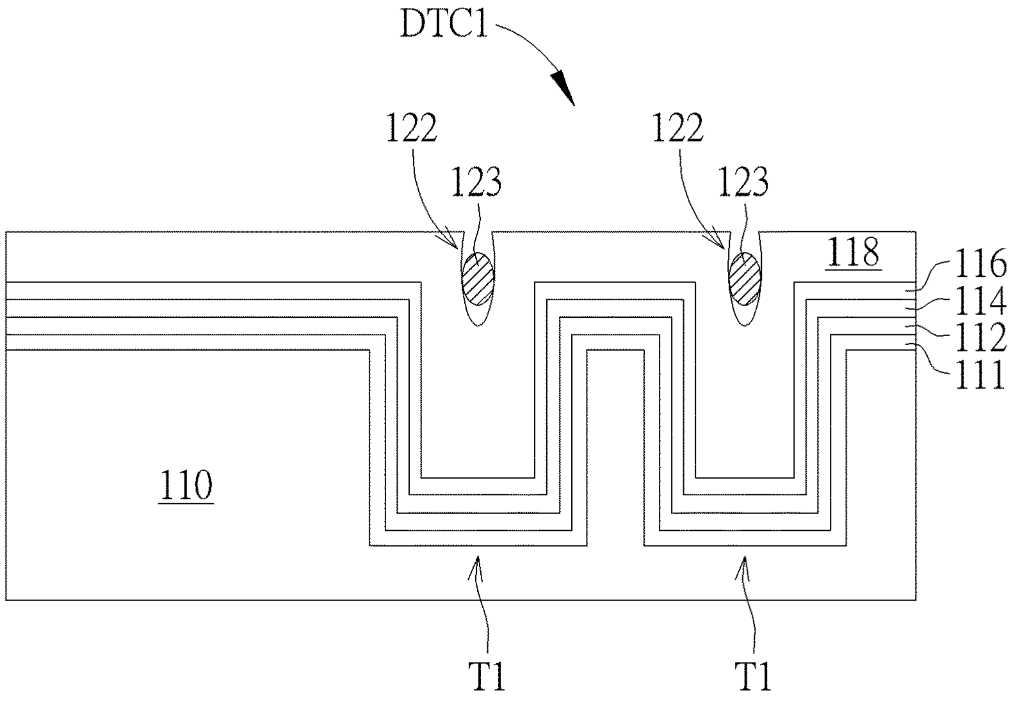
FIG. 2 is a schematic cross-sectional view of a deep trench capacitor after planarization according to an embodiment of the present invention.

Compared with the trench T1 of the first embodiment, the bottle-shaped trench T2 of this embodiment has different shapes, especially its lower part has a higher and wider bottom. After filling the dielectric layer 118 into the bottle-shaped trench T2, since the neck is the part with the narrowest width in the whole bottle-shaped trench T2, when filling the dielectric layer 118, the dielectric layers 118 on the side walls of the neck are easy to contact with each other, so the voids 120 are easier to form in the lower part P2 of the bottle-shaped trench T2 (see FIG. 1). In other words, the void 120 is easily confined in the lower part P2 of the bottle-shaped trench T2. In this way, since the position of the void 120 is far away from the top surface of the bottle-shaped trench T2, the polished surface will not overlap with the position of the void 120 in the subsequent planarization step such as chemical mechanical polishing, and the problem of residual polishing slurry on the surface of the dielectric layer 118 as shown in FIG. 2 will not occur. For example, the dielectric layer 118 is removed in the planarization step, and the top surface of the dielectric layer 118 is the surface where the planarization step stops. As shown in FIG. 3, it can be seen that the top surface of the dielectric layer 118 is higher than the top surface of the void 120. In this way, the existence of the void 120 in the deep trench capacitor structure can be ensured, and at the same time, the problem that the polishing slurry remains after the planarization step due to the void 120 being too close to the top of the trench can be avoided.

Subsequently, after the dielectric layer 118 is formed, a dielectric layer 124 can be selectively formed to cover the dielectric layer 118. The material of the dielectric layer 124 here is, for example, but not limited to, silicon oxide. In some other embodiments, the dielectric layer 124 can also be selectively not formed. Next, a contact structure CT1, a contact structure CT2 and a through silicon via TSV are formed, wherein the contact structure CT1 can be connected to the bottom electrode layer 112, the contact structure CT2 can be connected to the top electrode layer 116, and the through silicon via TSV penetrates through the substrate 110. The contact structure CT1 described here is used to electrically connect the bottom electrode layer 112 of the deep trench capacitor, and the contact structure CT2 is used to connect the top electrode layer 116 of the deep trench capacitor, so as to provide an electrical signal through the deep trench capacitor DTC2. The through silicon via TSV penetrates through the substrate 110, and is used for electrically connecting the components on the front and back sides of the substrate 110, or subsequently electrically connecting to the pins of other electronic components.

Figure 5:
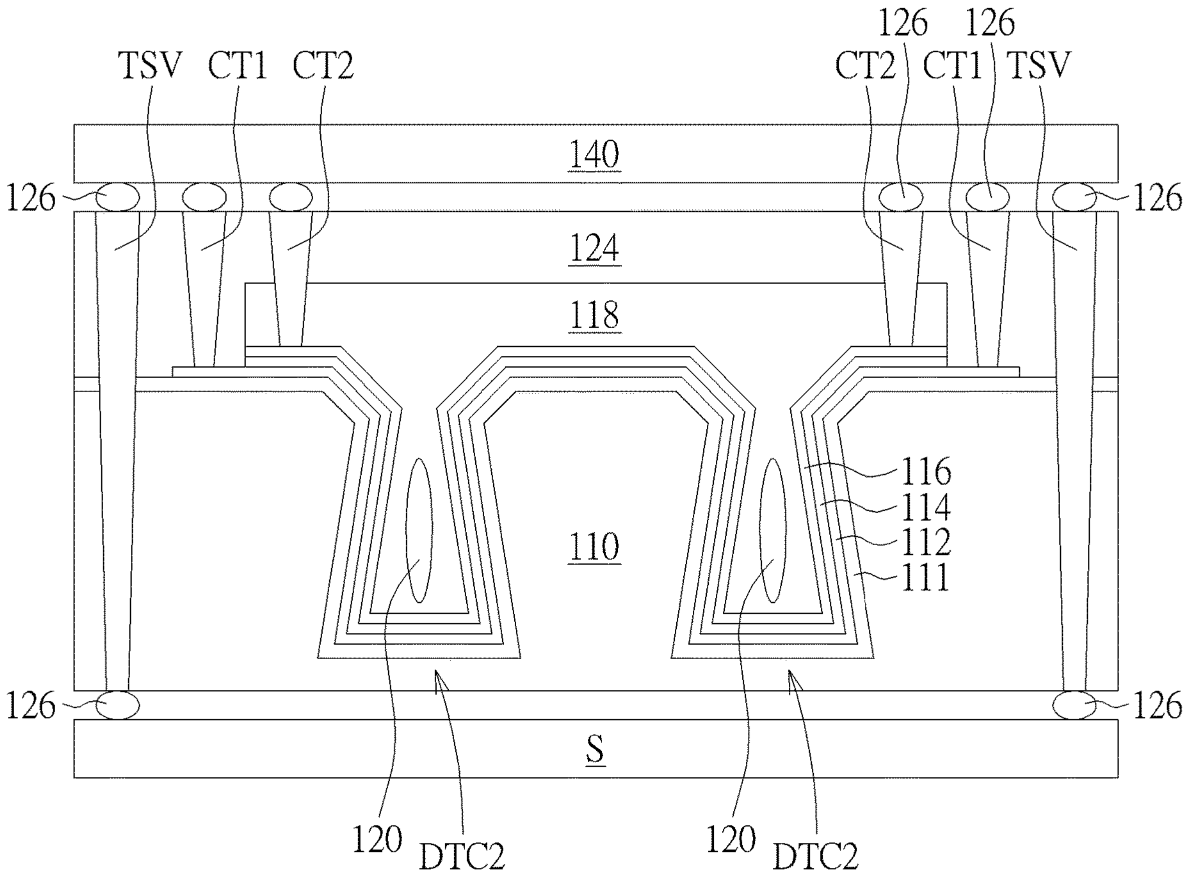
FIG. 5 is a schematic cross-sectional view of an electronic component according to an embodiment of the present invention.

FIG. 5 is a schematic cross-sectional view of an electronic component according to an embodiment of the present invention. Among them, the structure shown in FIG. 5 includes the deep trench capacitor DTC2, and this part of the structure is basically the same as that shown in FIG. 3, so it will not be repeated here. In this embodiment, the deep trench capacitor DTC2 shown in FIG. 3 is formed on a circuit board S, and further includes an electronic component or chip 140 located on and electrically connected to the deep trench capacitor. More specifically, the circuit board S described here is, for example, a printed circuit board (PCB) used in this field, and its material is, for example, glass fiber and plastic, which means that the material of the circuit board S is different from that of the substrate 110 (for example, silicon). In addition, the electronic component 140 is, for example, a chip, such as a system on chip including components such as a processor and a memory, but not limited thereto. The electronic component 140 can be electrically connected with the deep trench capacitor DTC2 through the conductive bumps 126, and the lower circuit substrate S can be electrically connected with the deep trench capacitor DTC2 through other conductive bumps 126. The conductive bump 126 described here is, for example, a solder bump or a wire layer, but it is not limited thereto.

As mentioned above, in the process of forming the deep trench capacitor DTC2 in the substrate 110, the substrate 110 may bear more stress, so it is easy to crack. In this embodiment, the deep trench capacitor DTC2 contains the void 120 located in the dielectric layer 118, so the void 120 can absorb the stress and reduce the possibility of the substrate 110 cracking. In addition, because the bottle-shaped trench T2 of the deep trench capacitor DTC2 has a special contour shape, it is easy to confine the void 120 to the lower part of the bottle-shaped trench T2, and it is not easy to cause the problem that the polishing slurry remains on the surface of the dielectric layer after the planarization step is performed (as shown in FIG. 2).

Based on the above description and drawings, the present invention provides a semiconductor structure containing deep trench capacitors, which comprises a substrate 110, wherein the substrate 110 contains a bottle-shaped trench T2, wherein the bottle-shaped trench T2 has an upper part P1 and a lower part P2 in cross section, and the interface between the upper part P1 and the lower part P2 is a bottleneck line (the line segment B), wherein the bottleneck line B is the part with the smallest width in the bottle-shaped trench T2. A first dielectric layer 118 is filled in the bottle-shaped trench T2, and a void 120 is located in the first dielectric layer 118, wherein the highest point of the void 120 is lower than the bottleneck line B.

In some embodiments of the present invention, a bottom electrode layer 112, an insulating layer 114 and a top electrode layer 116 are sequentially stacked in the bottle-shaped trench T2, and the bottom electrode layer 112, the insulating layer 114 and the top electrode layer 116 are located between the substrate 110 and the first dielectric layer 118.

In some embodiments of the present invention, a liner 111 is further included, which is located in the bottle-shaped trench T2 and between the substrate 110 and the bottom electrode layer 112.

In some embodiments of the present invention, there are at least two contact structures CT1 and CT2, wherein one contact structure CT1 is electrically connected to the bottom electrode layer 112 and the other contact structure CT2 is electrically connected to the top electrode layer 116.

In some embodiments of the present invention, the bottle-shaped trench T2 has a top surface (the line segment A) and a bottom surface (the line segment C), wherein the length from the top surface A to the bottleneck line B in a vertical direction is defined as H1, and the length from the bottom surface C to the bottleneck line B in a vertical direction is defined as H2, where H1/H2 is less than 0.15.

In some embodiments of the present invention, a point of intersection between the top surface A and the sidewall of the bottle-shaped trench T2 is defined as point A (point a1 in FIG. 3), a point of intersection between the bottleneck line B and the sidewall of the bottle-shaped trench T2 is defined as point B (point b1 in FIG. 3), and a point of intersection between the bottom surface C and the sidewall of the bottle-shaped trench T2 is defined as point C (point c1 in FIG. 3), wherein a connecting line between point A (point a1) and point B (point b1) is a first oblique line, and a connecting line between point B (point b1)and point C (point c1) is a second oblique line.

In some embodiments of the present invention, the slopes of the first oblique line and the second oblique line are different, and the first oblique line and the second oblique line are not a vertical line.

In some embodiments of the present invention, a width of the top surface A of the bottle-shaped trench T2 is defined as W1, a width of the bottleneck line B of the bottle-shaped trench T2 is defined as W2, and a width of the bottom surface C of the bottle-shaped trench T2 is defined as W3, where W2<W1, W2<W3, and W2 is between 0.1 micron and 1 micron, and W1 and W3 are between 0.2 micron and 3 micron.

In some embodiments of the present invention, the substrate 110 is an interposer, and the substrate 110 is located between a wafer 140 and a circuit board S.

In some embodiments of the present invention, it further includes a through silicon via TSV located in the substrate 110, and the through silicon via TSV is electrically connected to the chip 140 and the circuit board S.

The invention also provides a method for forming a semiconductor structure containing a deep trench capacitor, which comprises the following steps: providing a substrate 110, wherein a bottle-shaped trench T2 is formed in the substrate 110, wherein the bottle-shaped trench T2 has an upper part P1 and a lower part P2 in cross section, and the interface between the upper part P1 and the lower part P2 is a bottleneck line B, wherein the bottleneck line B is the part with the smallest width in the bottle-shaped trench T2. A first dielectric layer 118 is formed and filled in the bottle-shaped trench T2, wherein the first dielectric layer 118 contains a void 120 located in the first dielectric layer 118, and the highest point of the void 120 is lower than the bottleneck line B.

In some embodiments of the present invention, after the formation of the first dielectric layer 118, a planarization step is further included, wherein a surface where the planarization step stops is higher than a surface of the top electrode layer 116 (as shown in FIG. 3, the top surface of the first dielectric layer 118 is higher than the top surface of the top electrode layer 116 and higher than the top surface of the void 120).

In some embodiments of the present invention, after the planarization step, the void 120 is still located in the lower part P2 of the bottle-shaped trench T2 and is surrounded by the first dielectric layer 118.

To sum up, the present invention provides a structure for forming a deep trench capacitor on an interposer and a manufacturing method thereof. The present invention is characterized in that the trench of each deep trench capacitor is designed in a bottle shape and contains voids therein. Therefore, voids can be used to absorb stress and reduce the probability of interlayer (substrate) fracture. In addition, because the bottle-shaped trench can limit the voids to be located in the lower part of the whole bottle-shaped trench, the problem that the polishing slurry remains on the surface of the dielectric layer after the planarization step due to the excessively high voids can be avoided. The invention has the advantage of improving the product yield.

Those skilled in the art will readily observe that numerous modifications and alterations of the device and method may be made while retaining the teachings of the invention. Accordingly, the above disclosure should be construed as limited only by the metes and bounds of the appended

What is claimed is:

1. A semiconductor structure with a deep trench capacitor, comprising:

- a substrate, which contains a bottle-shaped trench, wherein the bottle-shaped trench has an upper part and a lower part in a cross section, and the interface between the upper part and the lower part is a bottleneck line, wherein the bottleneck line is the part with the smallest width in the bottle-shaped trench, wherein the bottle-shaped trench has a top surface and a bottom surface, wherein the length from the top surface to the bottleneck line in a vertical direction is defined as H1, and the length from the bottom surface to the bottleneck line in the vertical direction is defined as H2, where H1/H2 is less than 0.15;
- a first dielectric layer filled in the bottle-shaped trench; and
- a void located in the first dielectric layer, wherein a highest point of the void is lower than the bottleneck line.

2. The semiconductor structure with a deep trench capacitor according to claim 1, further comprising a bottom electrode layer, an insulating layer and a top electrode layer sequentially stacked in the bottle-shaped trench, and the bottom electrode layer, the insulating layer and the top electrode layer are located between the substrate and the first dielectric layer.

3. The semiconductor structure with a deep trench capacitor according to claim 2, further comprising a liner located in the bottle-shaped trench and between the substrate and the bottom electrode layer.

4. The semiconductor structure with a deep trench capacitor according to claim 2, further comprising at least two contact structures, wherein one of the contact structure is electrically connected to the bottom electrode layer and the other contact structure is electrically connected to the top electrode layer.

5. The semiconductor structure with a deep trench capacitor according to claim 1, wherein when viewed from the cross section view, an intersection point between the top surface and the sidewall of the bottle-shaped trench is defined as point A, an intersection point between the bottleneck line and the sidewall of the bottle-shaped trench is defined as point B, and an intersection point between the bottom surface and the sidewall of the bottle-shaped trench is defined as point C, wherein a connecting line between the point A and the point B is a first oblique line, and a connecting line between the point B and the point C is a second oblique line.

6. The semiconductor structure with a deep trench capacitor according to claim 5, wherein the slopes of the first oblique line and the second oblique line are different, and the first oblique line or the second oblique line are not a vertical line.

7. The semiconductor structure with a deep trench capacitor according to claim 1, wherein in the cross section, a width of the top surface of the bottle-shaped trench is defined as W1, a width of the bottleneck line of the bottle-shaped trench is defined as W2, and a width of the bottom surface of the bottle-shaped trench is defined as W3, where W2<W1, W2<W3, and W2 is between 0.1 micron and 1 micron, and W1 and W3 are between 0.2 micron and 3 micron.

8. The semiconductor structure with a deep trench capacitors according to claim 1, wherein the substrate is an interposer and is located between a chip and a circuit board.

9. The semiconductor structure with a deep trench capacitor according to claim 8, further comprising a through silicon via in the substrate, and the through silicon via is electrically connected to the chip and the circuit board.

10. A method for forming a semiconductor structure with a deep trench capacitor structure, comprising:

- providing a substrate, wherein a bottle-shaped trench is formed in the substrate, wherein the bottle-shaped trench has an upper part and a lower part as viewed from a cross section, and the interface between the upper part and the lower part is a bottleneck line, wherein the bottleneck line is the part with the smallest width in the bottle-shaped trench, wherein the bottle-shaped trench has a top surface and a bottom surface, wherein the length from the top surface to the bottleneck line in a vertical direction is defined as H1, and the length from the bottom surface to the bottleneck line in the vertical direction is defined as H2, where H1/H2 is less than 0.15; and
- forming a first dielectric layer to fill the bottle-shaped trench, wherein the first dielectric layer comprises a void in the first dielectric layer, and a highest point of the void is lower than the bottleneck line.

11. The method for forming a semiconductor structure with a deep trench capacitor structure according to claim 10, further comprising forming a bottom electrode layer, an insulating layer and a top electrode layer stacked in the bottle-shaped trench in sequence, and the bottom electrode layer, the insulating layer and the top electrode layer are located between the substrate and the first dielectric layer.

12. The method for forming a semiconductor structure with a deep trench capacitor structure according to claim 11, further comprising forming a liner in the bottle-shaped trench and between the substrate and the bottom electrode layer.

13. The method for forming a semiconductor structure with a deep trench capacitor structure according to claim 11, further comprising forming at least two contact structures, wherein one of the contact structure is electrically connected to the bottom electrode layer and the other contact structure is electrically connected to the top electrode layer.

14. The method for forming a semiconductor structure with a deep trench capacitor structure according to claim 11, further comprising performing a planarization step after the first dielectric layer is formed, wherein a surface stopped by the planarization step is higher than a surface of the top electrode layer.

15. The method for forming a semiconductor structure with a deep trench capacitor structure according to claim 14, wherein after the planarization step, the void is still located in the lower part of the bottle-shaped trench and surrounded by the first dielectric layer.

16. The method for forming a semiconductor structure with a deep trench capacitor structure according to claim 10, wherein when viewed from the cross section view, an intersection point between the top surface and the sidewall of the bottle-shaped trench is defined as point A, an intersection point between the bottleneck line and the sidewall of the bottle-shaped trench is defined as point B, and an intersection point between the bottom surface and the sidewall of the bottle-shaped trench is defined as point C, wherein a connecting line between the point A and the point B is a first oblique line, and a connecting line between the point B and the point C is a second oblique line.

17. The method for forming a semiconductor structure with a deep trench capacitor structure according to claim 10, wherein the substrate is an interposer and is located between a chip and a circuit board.

18. The method for forming a semiconductor structure with a deep trench capacitor structure according to claim 17, further comprising forming a through silicon via in the substrate, and the through silicon via is electrically connected to the chip and the circuit board.

* * * * *